US010848165B1

(12) United States Patent
Srivastava et al.

(10) Patent No.: US 10,848,165 B1
(45) Date of Patent: Nov. 24, 2020

(54) PERFORMING LOW POWER REFRESH OF A DIGITAL-TO-ANALOG CONVERTER CIRCUIT

(71) Applicant: Silicon Laboratories Inc., Austin, TX (US)

(72) Inventors: Mudit Srivastava, Singapore (SG); Paul Zavalney, Austin, TX (US); William Durbin, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/417,700

(22) Filed: May 21, 2019

(51) Int. Cl.
*H03M 1/66* (2006.01)
*H03M 1/00* (2006.01)

(52) U.S. Cl.
CPC .................. *H03M 1/002* (2013.01)

(58) Field of Classification Search
CPC ...... H03M 1/0682; H03M 3/358; H03M 3/50; H03M 3/502; H03M 1/804; H03M 1/00; H03M 1/06; H03M 1/0646; H03M 1/66; H03M 1/662; H03M 1/68; H03M 1/687; H03M 1/80; H03M 1/808; H03M 1/0872; H03M 1/36; H03M 1/682; H03M 1/765; H03M 9/00; H03K 19/0016; H03K 19/20; H03K 7/10
USPC .................. 341/142, 144, 118–121
See application file for complete search history.

(56) References Cited

U.S. PATENT DOCUMENTS

| | | | | | |
|---|---|---|---|---|---|
| 3,996,419 | A | * | 12/1976 | Kennedy | H04N 5/211 348/611 |
| 5,475,402 | A | * | 12/1995 | Hijikata | G06F 1/3218 345/211 |
| 5,525,874 | A | * | 6/1996 | Mallarapu | H02M 7/53873 318/400.06 |
| 5,953,020 | A | * | 9/1999 | Wang | G09G 5/395 345/501 |
| 7,539,538 | B2 | | 5/2009 | Parramon et al. | |
| 2002/0051396 | A1 | * | 5/2002 | Higashiho | G11C 11/4076 365/222 |
| 2003/0090400 | A1 | * | 5/2003 | Barker | H03M 1/662 341/144 |
| 2009/0231176 | A1 | * | 9/2009 | Chen | H03M 1/0614 341/150 |
| 2016/0341819 | A1 | * | 11/2016 | Venkataraman | G01S 7/484 |

OTHER PUBLICATIONS

Silicon Labs, "EFR32FG14 Flex Gecko Proprietary Protocol SoC Family Data Sheet," Rev. 1.2, Feb. 23, 2017, 163 pages.

* cited by examiner

*Primary Examiner* — Linh V Nguyen
(74) *Attorney, Agent, or Firm* — Trop, Pruner & Hu, P.C.

(57) ABSTRACT

In one embodiment, an apparatus includes: a digital-to-analog converter (DAC) circuit having a digital portion to receive a digital value and an analog portion to generate an analog voltage based on the digital value; and a refresh circuit coupled to the DAC circuit to clock gate provision of a first clock signal to the DAC circuit when the digital portion is inactive.

18 Claims, 5 Drawing Sheets

US 10,848,165 B1

PERFORMING LOW POWER REFRESH OF A DIGITAL-TO-ANALOG CONVERTER CIRCUIT

BACKGROUND

In many systems, a digital-to-analog converter (DAC) circuit is used to convert a digital value into an analog value. One example usage of a DAC circuit is to generate an analog reference voltage. An analog portion of the DAC circuit may cause a digital portion of the DAC circuit to be in full operation to perform a periodic refresh of the voltage output to enable maintenance of the reference voltage. However by maintaining the digital portion always powered, the DAC circuit can consume an undesirably high amount of dynamic power.

SUMMARY OF THE INVENTION

In one aspect, an apparatus includes: a digital-to-analog converter (DAC) circuit having a digital portion to receive a digital value and an analog portion to generate an analog voltage based on the digital value; and a refresh circuit coupled to the DAC circuit to clock gate provision of a first clock signal to the DAC circuit when the digital portion is inactive. In an example, the refresh circuit is, in response to overflow of a first timer, to provide the first clock signal to the DAC circuit to enable the DAC circuit to refresh the analog voltage according to the digital value. The DAC circuit may send a refresh completion signal to the refresh circuit after the analog voltage refresh, and the refresh circuit is to clock gate the provision of the first clock signal to the DAC circuit in response thereto.

In an example, the first timer is clocked with a second clock signal having a substantially lower frequency than the first clock signal. The first timer may be configurable to overflow at a controllable duration. The first timer may send an overflow signal to a latch circuit of the refresh circuit in response to the overflow to cause the first clock signal to be ungated. The DAC circuit may send a refresh completion signal to the latch circuit in response to completion of the analog voltage refresh. This latch circuit may cause the first clock signal to be clock gated in response to the refresh completion signal.

In an example, the digital portion includes a buffer circuit to store a plurality of digital values, and the digital portion is to send a selected one of the plurality of digital values to the analog portion in response to a conversion trigger. The digital portion may send the selected one of the plurality of digital values to the analog portion in response to a refresh trigger following the conversion trigger.

In another aspect, a method includes: generating, in a DAC, an analog voltage from a digital value; after generating the analog voltage, gating a clock signal from being provided to a digital portion of the DAC; in response to receiving a refresh trigger, providing the clock signal to the digital portion of the DAC and generating the analog voltage according to the digital value; and thereafter gating the clock signal from being provided to the digital portion of the DAC.

In an example, the method includes generating the refresh trigger in response to an overflow of a timer clocked with a second clock signal having a substantially lower frequency than the clock signal. In response to receiving a sample conversion trigger, the clock signal may be provided to the digital portion of the DAC and the analog voltage is generated according to a selected digital value stored in the DAC. The method may further include: receiving a new digital value while the clock signal is gated; storing the new digital value in a buffer of the DAC; in response to a sample conversion trigger, providing the clock signal to the digital portion of the DAC and generating the analog voltage according to the new digital value. In response to receiving a refresh trigger after receiving the sample conversion trigger, the clock signal may be provided to the digital portion of the DAC and the analog voltage generated according to the new digital value. A capacitor may be charged with the analog voltage to maintain a reference voltage, as one use case.

In another aspect, an integrated circuit includes: digital circuitry; clock generation circuitry to generate at least one clock signal; and an analog interface. The analog interface may include a DAC circuit having: a digital portion to operate at a first clock signal, the digital portion to receive a digital value; and an analog portion to generate an analog voltage based on the digital value. A control circuit may be coupled to the DAC circuit, to clock gate provision of the first clock signal to the digital portion in absence of a conversion trigger or a refresh trigger. The analog interface may further include a comparator coupled to the DAC circuit, to receive a first analog voltage from a source circuit and a reference voltage from the DAC circuit, and compare the first analog voltage to the reference voltage. In response to the refresh trigger, the control circuit is to enable the first clock signal to be provided to the digital portion to cause the DAC circuit to output the reference voltage to the comparator to refresh a storage element.

In an example, the control circuit comprises a first timer, and in response to expiration of the first timer, the control circuit is to enable the first clock signal to be provided to the digital portion to cause the DAC circuit to output the reference voltage to the comparator to refresh the storage element, the expiration of the first timer comprising the refresh trigger. The first timer may be clocked with a second clock signal having a substantially lower frequency than the first clock signal. The control circuit may prioritize the conversion trigger over the refresh trigger.

DETAILED DESCRIPTION

In various embodiments, techniques are provided to enable low power operation of a digital-to-analog converter (DAC) circuit. More specifically, techniques may be used to reduce power consumption by the DAC circuit when it is not needed to perform a conversion, either in response to a conversion trigger or for refreshing an analog voltage. Understand that such periodic refresh mechanism operates independently from conventional DAC operation. As such, DAC sample conversion and periodic voltage maintenance at a load may co-exist. In embodiments, this periodic refresh mechanism may operate with respect to a different clock signal. This different clock signal may be asynchronous to a DAC clock signal at which the DAC circuit operates. In addition, this ancillary clock signal may operate at a much lower frequency. In this way, at least digital portions of the DAC circuit may be powered off between refresh intervals, reducing power consumption, particularly when a circuit including the DAC is in a low power mode. Further note that the refresh operation may be performed using an existing data sample, such that the refresh mechanism does not trigger a new DAC sample conversion. As a result, sample data loading and unloading within buffer circuitry of the digital portion of the DAC (in preparation for a next conversion operation) may occur within the refresh time interval.

Figure 1:
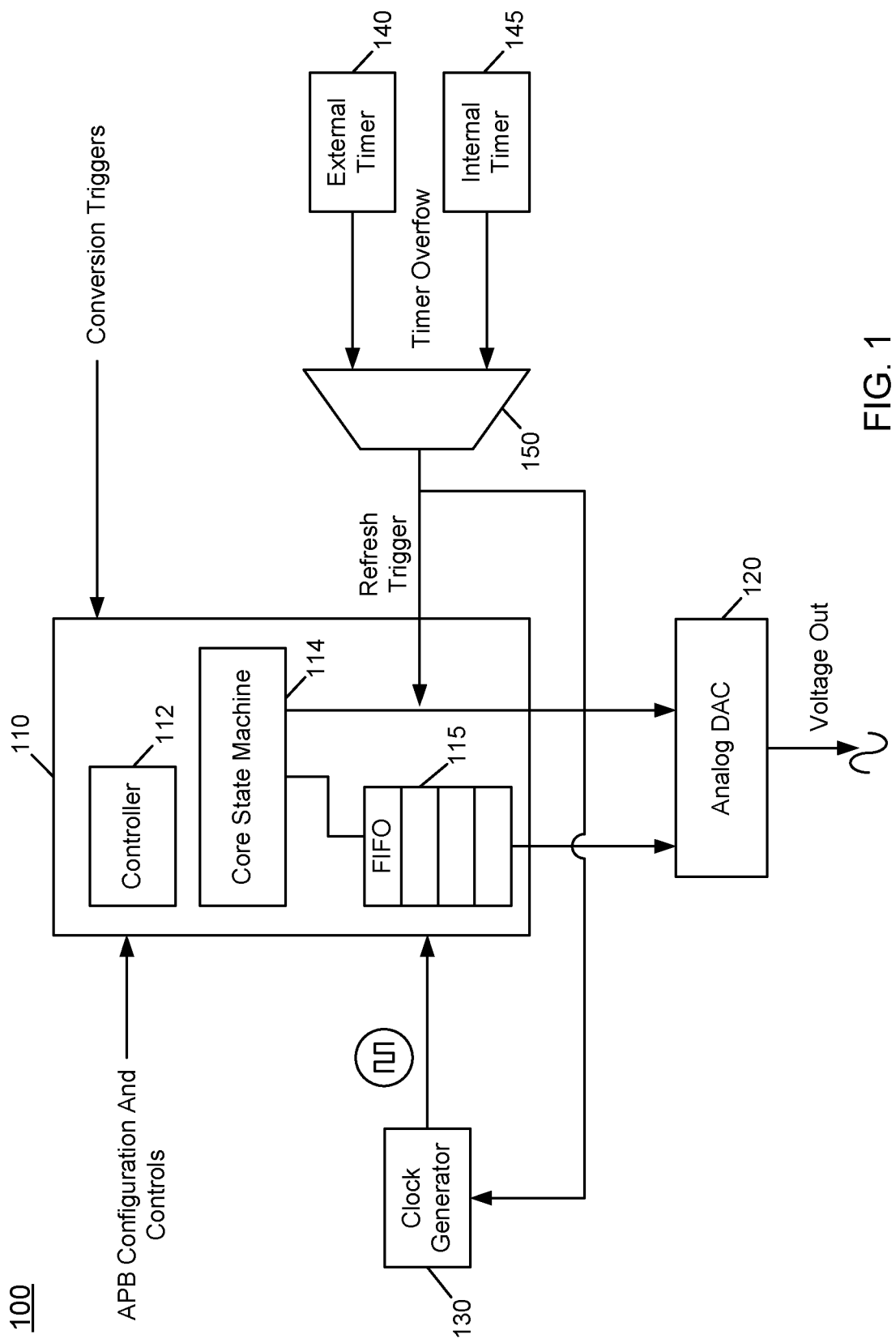
FIG. 1 is a block diagram of a portion of a digital-to-analog converter (DAC) circuit in accordance with an embodiment.

Referring now to FIG. 1, shown is a block diagram of a portion of a DAC circuit in accordance with an embodiment. As shown in FIG. 1, circuit 100 may include at least a portion of a DAC such as a voltage DAC and related timing circuitry to enable low power operation of the DAC as described herein. In different implementations, all the circuitry shown in FIG. 1 may be included in the DAC circuit, while in other cases at least some of the logic circuitry may be located externally to the DAC. In any event, understand that FIG. 1 shows a representative circuit to enable refresh activity to occur within the DAC while reducing power consumption.

As illustrated, circuit 100 includes a digital portion 110, which may include various digital circuitry of the DAC. Digital portion 110 includes a controller 112, which may be any type of control circuit to perform sample triggers, inputs, resets, clock control and configuration pertaining to digital portion 110. In addition, a core state machine 114, which may be implemented as a finite state machine in an embodiment, may be used to generate necessary controls and sequences for an analog portion of the DAC circuit. As further shown, digital portion 110 also includes a buffer structure 115, which in an embodiment may be implemented as a first-in first-out (FIFO) buffer. Buffer structure 115 may store a plurality of digital samples, each of which corresponds to a digital representation of a voltage to be generated by an analog portion of the DAC, illustrated as analog DAC circuit 120. Thus, a selected entry, e.g., a top entry of buffer 115, may be output to analog DAC circuit 120, to enable generation of an analog voltage output. Digital portion 110 further receives incoming configuration information, including refresh rate information as described herein, via configuration and control signals, e.g., via a peripheral bus.

Understand that a voltage DAC as described herein may be used to generate a variety of different voltage outputs, each of which may be used as a reference voltage for performing analog comparisons with incoming analog data, such as received from one or more sensors. The voltage DAC also may be used to provide stimulus for control feedback loops, or biasing/power for other circuits or sensors.

To enable normal operation of digital portion 110, a clock generator 130 provides a clock signal that is used to generate a DAC clock signal. Understand that the frequency of this clock signal may vary in different implementations. As examples, this DAC clock signal may be provided at a frequency between 32 kilohertz (kHz) and 80 megahertz (MHz). In different embodiments, clock generator 130 may be implemented as a phase lock loop (PLL) or any other type of clock generation circuit. In one embodiment, clock generator 130 generates a clock signal at a maximum of 1 MHz, which is provided on request based on refresh/conversion triggers, such that the clock signal is by default gated internally until an event that requests conversion/refresh occurs. In a particular embodiment, core state machine 114 runs at 1 MHz, and a maximum sampling rate of analog DAC circuit 120 is 0.5 MHz. It is possible for FIFO 115, controller 112, and other circuitry in digital portion 110 to operate at frequencies between 1 MHz to 80 MHz for quick configuration. Stated another way, clock generator 130 generates a prescaled clock signal to run at a frequency aligned to generate controls for analog DAC circuit 120.

To effect power savings when the DAC is not active, embodiments may perform clock gating of this DAC clock signal. More specifically as further illustrated in FIG. 1, various triggers may be input to digital portion 110 to ungate this clock signal to enable normal operation. Otherwise, in the absence of one of these triggers, the DAC clock signal may be clock gated, to reduce power consumption. To this end, digital portion 110 may receive conversion triggers from various consumers of the DAC output. More specifically, according to different operating schedules, when a sensor has a value to be sensed, it may send a conversion trigger to digital portion 110 to cause the DAC clock signal to be ungated.

In addition to the conversion triggers, a refresh trigger may be provided as described herein to cause the DAC to refresh its output so that a reference voltage, e.g., as stored on a capacitor, may be maintained at a desired value.

To effect the clock gating and triggering of a refresh operation as described herein, multiple sources of refresh triggers may be provided. As illustrated in FIG. 1, a first refresh source may be via an external timer 140, which provides a timer overflow signal. Such external timer 140 may be present in another component of a platform. Other external sources can be an on-chip low frequency timer peripheral running during sleep mode and generating overflow to provide a trigger to DAC. In addition, an internal timer 145 may trigger a refresh. Details of a representative internal timer are described below with regard to FIG. 2. In other cases, the conversion trigger can also come externally via a GPIO pin, an external timer peripheral, or an internal timer peripheral that may run at the DAC conversion rate, different from the refresh timers. In addition, an analog-to-digital converter (ADC) or any other on-chip peripheral can provide a conversion trigger via an interconnect matrix that connects multiple peripherals together.

A selection circuit 150, e.g., a multiplexer, may be controlled to provide a selected one of these trigger signals out as a refresh trigger, which as shown is sent both to digital portion 110 and clock generator 130. In different embodiments, selection circuit 150 may be statically or dynamically configured based upon implementation in a given system. Understand while shown at this high level in the embodiment of FIG. 1, many variations and alternatives are possible.

Figure 2:
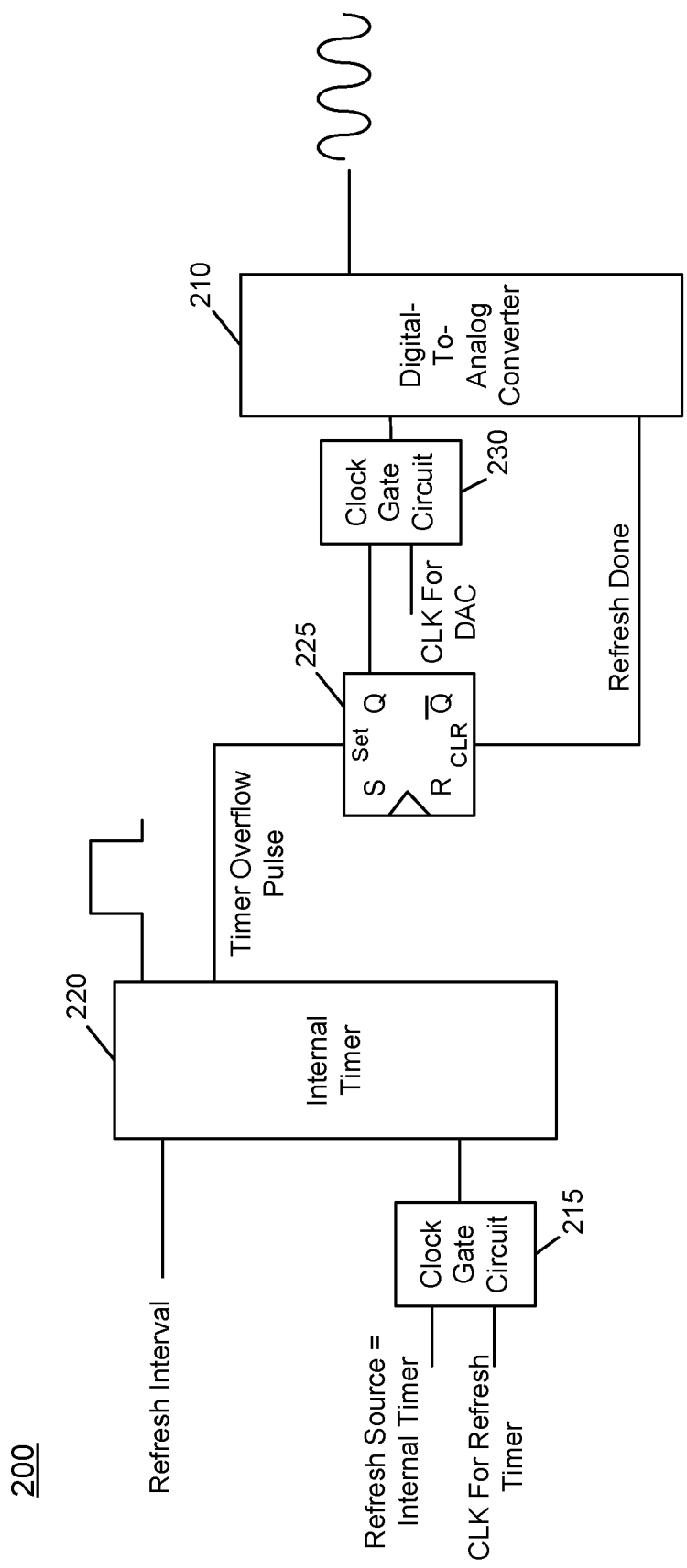
FIG. 2 is a block diagram of a circuit arrangement for performing low power refresh in accordance with an embodiment.

Referring now to FIG. 2, shown is a block diagram of a circuit arrangement 200 for performing low power refresh in accordance with an embodiment. As shown in FIG. 2, circuit arrangement 200 is a refresh circuit that may be used to clock gate provision of a DAC clock signal to a DAC circuit 210, in the absence of a refresh trigger. More specifically as shown in FIG. 2, circuit arrangement 200 includes a first clock gate circuit 215 coupled to receive a control signal, which when set is to cause refresh triggers to be provided by way of the refresh circuit. Clock gate circuit 215 may, in embodiments be implemented as an AND gate or an integrated clock gating cell (ICG) circuit. In an embodiment, the control signal may be set using configuration information. Clock gate circuit 215 further receives a clock signal for a refresh timer. In various embodiments, this refresh timer clock signal may be set at a relatively low frequency, and more particularly a frequency substantially lower than the DAC clock signal itself. And understand that this refresh timer clock signal may be asynchronous to the DAC clock signal. In embodiments herein, this refresh timer clock signal may be set at 32 kHz. Of course other low frequencies are possible in other embodiments. Note that when the control signal is not active, clock gate circuit 215 outputs a logic low, causing an internal timer 220 to not operate. In an embodiment in which an ICG circuit is used, the circuit may be latched with an enable signal and a gate coupled together, to avoid a glitch in the clock signal.

As further shown, the output of clock gate circuit 215 is provided as a clock signal to internal timer 220. As shown, internal timer 220 is configured to perform a count operation for a refresh time interval, which in an embodiment may be a configurable value received via a refresh interval input. This refresh interval input thus provides a configurable cycle count, corresponding to a number of cycles of the refresh timer signal that are counted before a timer overflow pulse is output from internal timer 220. This refresh interval is used to time the charge/discharge time of an external capacitor to ensure a constant voltage at the output.

As illustrated, this timer overflow pulse signal is provided to a latch circuit 225 which in an embodiment may be implemented as an SR latch. In the embodiment shown, the timer overflow pulse signal may be provided to a set input of latch circuit 225. As such, on a positive-going pulse of this timer overflow pulse signal, the output of latch circuit 225 goes high. This latch output signal is provided as a first input to another clock gate circuit 230. As further shown, clock gate circuit 230 has a second input to receive the DAC clock signal. This DAC clock signal may be at a substantially greater frequency than the refresh timer signal. For example, this DAC clock signal may be controlled to operate at, e.g., 1 MHz. When the latch output goes high, the DAC clock signal is thus ungated and is provided to a digital portion of DAC circuit 210, to enable generation of an analog voltage output. Note that after this analog voltage is output, DAC circuit 210 issues a refresh done signal, which is provided to a clear (CLR) input of latch circuit 225, thus pulling the output of latch circuit 225 low, causing clock gate circuit 230 to clock gate the DAC clock signal. In this way, substantial power savings may be realized, as in the absence of a refresh trigger issued from internal timer 220, the DAC clock signal is thus clock gated via clock gate circuit 230. Understand while shown at this high level in the embodiment of FIG. 2, many variations and alternatives are possible.

Figure 3:
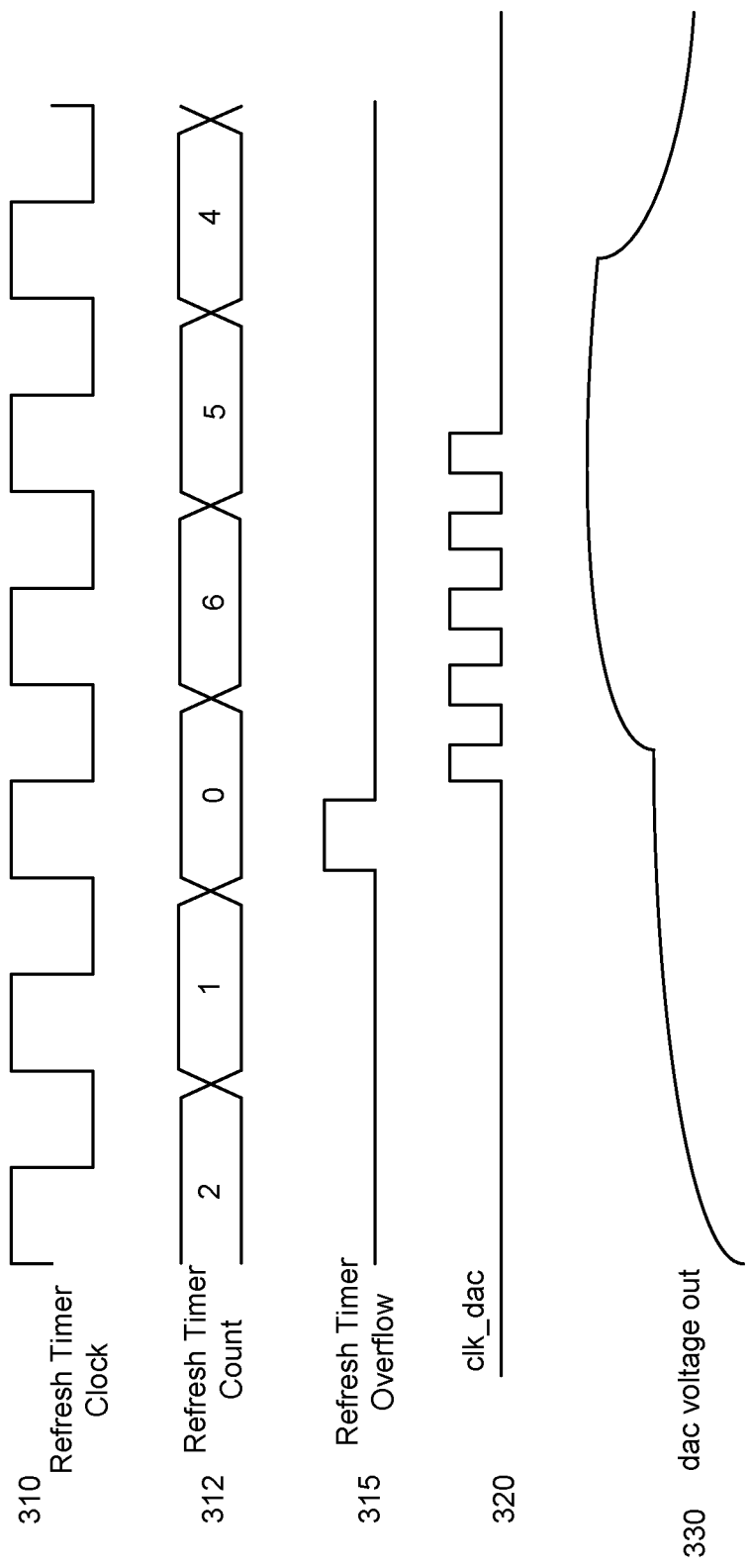
FIG. 3 is a timing diagram in accordance with an embodiment.

Referring now to FIG. 3, shown is a timing diagram in accordance with an embodiment. As shown in FIG. 3, various clock signals are present, including a refresh timer clock signal 310 and a DAC clock signal 320. Note that until a refresh timer count 312 reaches an overflow condition, DAC clock signal 320 is clock gated, reducing power consumption. And as shown, upon an overflow of refresh timer count 312, a refresh timer overflow signal 315 is issued, causing DAC clock signal 320 to be ungated, to allow a low power refresh operation to occur such that an analog voltage output 330 is generated and sent from the DAC to a given destination, such as a storage element, e.g., a capacitor, which holds the charge corresponding to the voltage, such that the voltage may be used as a reference voltage for a comparison operation.

Note that in response to a refresh trigger, the same settings may be controlled within the analog portion of the DAC to ensure that the DAC outputs the same analog voltage that it previously output, allowing this refresh analog voltage output to be used to refresh a stored analog voltage (e.g., present on a capacitor). After the sample refresh operation is done, both analog and digital portions of the DAC may enter into a low power state, while the refresh circuitry (operating at the lower refresh timer clock signal 310) continues to operate.

With an embodiment that performs refreshes, the DAC may generate a constant reference voltage for a load. Understand that during a refresh interval, it is possible for a new sample data conversion to occur. When such new sample data rate conversion occurs, the next refresh operation is performed with a new voltage output. Understand that it is also possible in embodiments to maintain a voltage profiling for an application, such that regular voltage updates may be realized with periodic refreshes as described herein. Embodiments may further support parallel data loading/unloading within buffer circuitry of a digital portion of the DAC during a refresh interval, as the clock domains are segregated, and a refresh request is handled asynchronously within the DAC.

Figure 4:
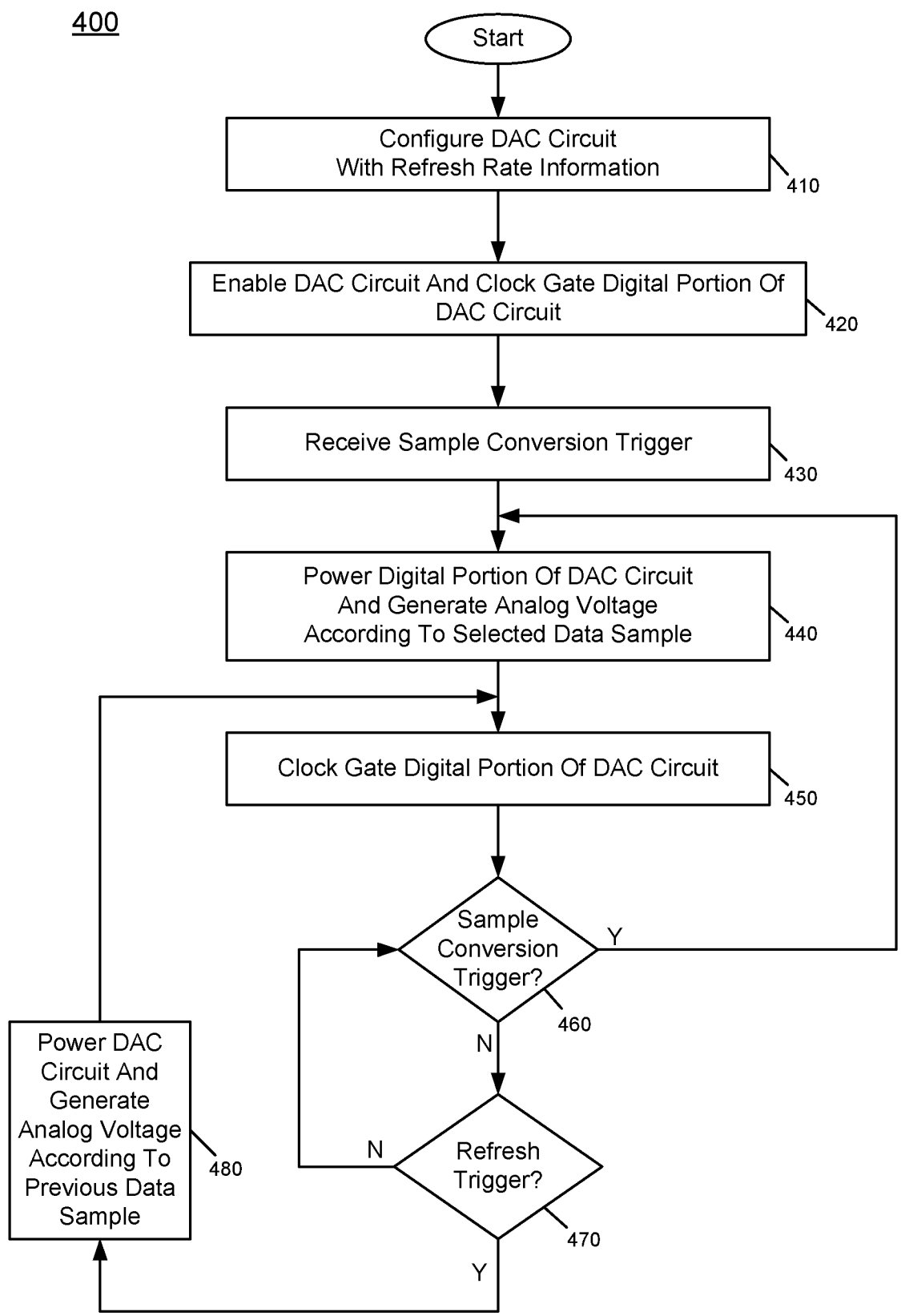
FIG. 4 is a flow diagram of a method in accordance with an embodiment.

Referring now to FIG. 4, shown is a flow diagram of a method in accordance with an embodiment. As shown in FIG. 4, method 400 is a method for controlling a DAC circuit to operate with low power consumption. As such, method 400 may be performed by a DAC circuit and controller circuitry of the DAC circuit, including hardware circuitry, firmware, software and/or combinations thereof. As illustrated, method 400 begins by configuring DAC circuitry with refresh rate information (block 410). More specifically, depending upon a use case, a refresh rate can be determined for control of the DAC. Such refresh rate may be based upon characteristics of storage elements such as capacitors that store charge corresponding to voltages output by the DAC circuit. Next at block 420 the DAC circuit may be enabled for normal operation. And at this point, the digital portion of the DAC circuit may be clock gated.

Still with reference to FIG. 4, next a sample conversion trigger is received (block 430). Understand that there may be multiple such sample conversion triggers that are issued by various consumers of a voltage output by the DAC circuit. In response to such sample conversion trigger, control passes to block 440 where a digital portion of the DAC circuit may be powered up (including ungating the DAC clock signal). In this situation, the powered up DAC circuit may generate an analog voltage according to a selected data sample. As described herein a FIFO or other buffer circuit of the DAC circuit may store various digital data values, and a selected data sample can be used to generate the analog voltage, which may be provided to a given destination.

Still with reference to FIG. 4, next at block 450 the digital portion of the DAC circuit may be clock gated, to realize reduced power consumption. Next it is determined whether a sample conversion trigger is received (diamond 460). If so, operation passes back to block 440 discussed above. Otherwise, in the absence of such sample conversion trigger, control passes to diamond 470 to determine whether a refresh trigger has been received. Note in an example implementation, for a timed application the expected interval between any trigger is two DAC clock cycles (maximum 1 MHz) in the maximum case. This implies that there is a minimum of 2 microseconds of interval.

Although FIG. 4 shows an arrangement in which it is first determined whether a conversion trigger occurs prior to determining whether a refresh trigger occurs, this order may vary. That is, the illustration of FIG. 4 is at a high level, and variations are possible. For example, refresh and conversion triggers may co-exist. In an embodiment, should such triggers occur at least substantially concurrently, the conversion trigger may be handled with greater priority than the refresh trigger. But in case a conversion trigger is received during a refresh operation, the conversion trigger is held until the refresh conversion finishes and then the sample conversion trigger is served, such that it is delayed but still served. However in case a refresh trigger is received during a conversion operation, it is simply ignored.

In response to receipt of such a refresh trigger (which may occur at a relatively low rate, as described herein), control passes to block 480, where the digital portion of the DAC circuit may be powered up (including ungating the DAC clock signal). In this situation, the powered up DAC circuit may generate an analog voltage according to the previous data sample to enable a refresh operation to occur. After the desired analog voltage is generated, control again passes to block 450 where the digital portion of the DAC circuit is clock gated. Understand while shown at this high level in the embodiment of FIG. 4, many variations and alternatives are possible.

Figure 5:
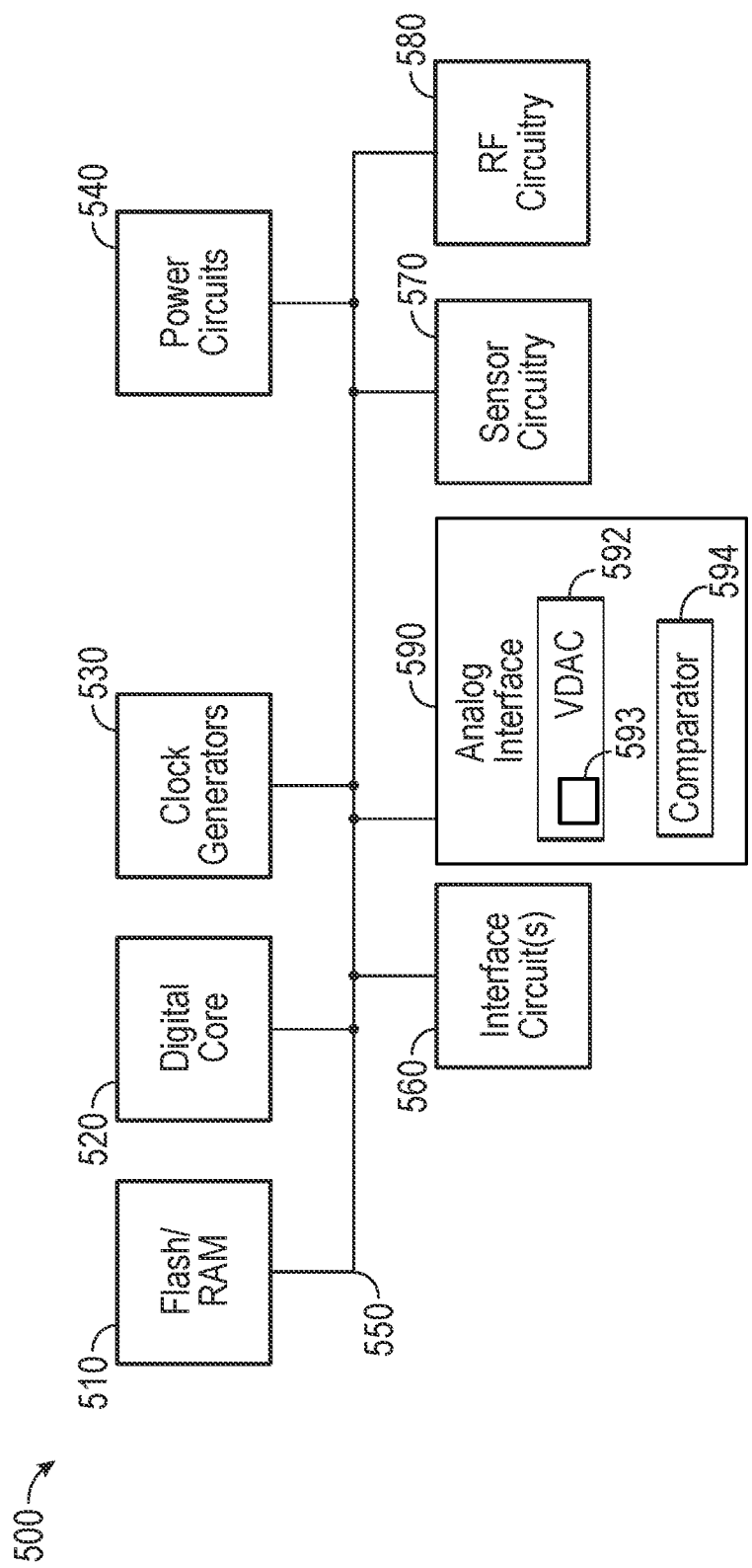
FIG. 5 is a block diagram of a representative integrated circuit in accordance with an embodiment.

Referring now to FIG. 5, shown is a block diagram of a representative integrated circuit 500 which may include refresh circuitry to enable low power refresh operations to occur in a DAC as described herein. In the embodiment shown in FIG. 5, integrated circuit 500 may be, e.g., a microcontroller, wireless transceiver or other device that can be used for a variety of use cases, including sensing, monitoring, embedded applications, communications applications and so forth. In the embodiment shown, integrated circuit 500 includes a memory system 510 which in an embodiment may include a non-volatile memory such as a flash memory and volatile storage, such as RAM. Memory system 510 couples via a bus 550 to a digital core 520, which may include one or more cores and/or microcontrollers that act as a main processing unit of the integrated circuit. In turn, digital core 520 may couple to clock generators 530 which may provide one or more phase lock loops or other clock generation circuitry to generate various clocks for use by circuitry of the IC. As such, clock generators 530 may include clock generation circuitry to generate a clock for use by DAC circuitry, as well as another clock signal, namely a lower frequency asynchronous clock signal that may be used to trigger refresh operations as described herein. As further illustrated, IC 500 further includes power circuitry 540. Such power circuits may include one or more voltage regulators.

As further illustrated in FIG. 5, additional circuitry may optionally be present depending on particular implementation to provide various functionality and interaction with external devices. Such circuitry may include interface circuitry 560 which may provide an interface with various off-chip devices, sensor circuitry 570 which may include various on-chip sensors including digital and analog sensors to sense desired signals or so forth. In addition as shown in FIG. 5, RF circuitry 580 may be provided which may include analog circuitry of a transceiver to enable transmission and receipt of wireless signals, e.g., according to one or more of a local area or wide area wireless communication scheme, such as Zigbee, Bluetooth, IEEE 802.11, cellular communication or so forth.

Still with reference to FIG. 5, an analog interface 590 is present. Such analog interface may be used to interface between digital and analog circuitry and effect conversions of signaling therebetween. In relevant aspects herein, analog interface 590 may include at least one VDAC 592, which may generate an analog voltage in response to a received digital sample. Such analog voltage may be provided to a comparator 594 (as an example), which may use this incoming analog voltage as a reference voltage for purposes of performing a comparison to an analog signal received from some sensor circuitry (either located on-chip or off-chip). To perform a low power refresh within VDAC 592 to enable maintenance of this reference voltage on a storage element (e.g., a capacitor included in or coupled to comparator 594), VDAC 592 is illustrated with a refresh circuit 593, which may trigger a refresh operation to be performed by causing an ungating of a DAC clock signal. After the refresh operation is completed the clock signal may again be gated to reduce power consumption in the absence of a refresh or conversion trigger, as described herein. Understand while shown with this high level view, many variations and alternatives are possible.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
a digital-to-analog converter (DAC) circuit comprising a digital portion to receive a digital value and an analog portion to generate an analog voltage based on the digital value; and
a refresh circuit coupled to the DAC circuit, the refresh circuit to clock gate provision of a first clock signal to the DAC circuit when the digital portion is inactive, wherein the refresh circuit is, in response to overflow of a first timer, to provide the first clock signal to the DAC circuit to enable the DAC circuit to refresh the analog voltage according to the digital value.

2. The apparatus of claim 1, wherein the DAC circuit is to send a refresh completion signal to the refresh circuit after the analog voltage refresh, and the refresh circuit is to clock gate the provision of the first clock signal to the DAC circuit in response thereto.

3. The apparatus of claim 1, wherein the first timer is clocked with a second clock signal, the second clock signal having a substantially lower frequency than the first clock signal.

4. The apparatus of claim 1, wherein the first timer is configurable to overflow at a controllable duration.

5. The apparatus of claim 1, wherein the first timer is to send an overflow signal to a latch circuit of the refresh circuit in response to the overflow to cause the first clock signal to be ungated.

6. The apparatus of claim 5, wherein the DAC circuit is to send a refresh completion signal to the latch circuit in response to completion of the analog voltage refresh.

7. The apparatus of claim 6, wherein the latch circuit is to cause the first clock signal to be clock gated in response to the refresh completion signal.

8. The apparatus of claim 1, wherein the digital portion comprises a buffer circuit to store a plurality of digital values, and wherein the digital portion is to send a selected one of the plurality of digital values to the analog portion in response to a conversion trigger.

9. The apparatus of claim 8, wherein the digital portion is to send the selected one of the plurality of digital values to the analog portion in response to a refresh trigger following the conversion trigger.

10. A method comprising:
generating, in a digital-to-analog converter (DAC), an analog voltage from a digital value;
after generating the analog voltage, gating a clock signal from being provided to a digital portion of the DAC;
generating a refresh trigger in response to an overflow of a timer, the timer clocked with a second clock signal having a substantially lower frequency than the clock signal;
in response to the refresh trigger, providing the clock signal to the digital portion of the DAC and generating the analog voltage according to the digital value; and
thereafter gating the clock signal from being provided to the digital portion of the DAC.

11. The method of claim 10, further comprising in response to receiving a sample conversion trigger, providing the clock signal to the digital portion of the DAC and generating the analog voltage according to a selected digital value stored in the DAC.

12. The method of claim 10, further comprising:
receiving a new digital value while the clock signal is gated;
storing the new digital value in a buffer of the DAC;
in response to a sample conversion trigger, providing the clock signal to the digital portion of the DAC and generating the analog voltage according to the new digital value.

13. The method of claim 12, further comprising, in response to receiving a refresh trigger after receiving the sample conversion trigger, providing the clock signal to the digital portion of the DAC and generating the analog voltage according to the new digital value.

14. The method of claim 10, further comprising charging a capacitor with the analog voltage to maintain a reference voltage.

15. An integrated circuit comprising:
digital circuitry;
clock generation circuitry to generate at least one clock signal; and
an analog interface comprising:
a digital-to-analog converter (DAC) circuit having:
a digital portion to operate at a first clock signal, the digital portion to receive a digital value; and
an analog portion to generate an analog voltage based on the digital value;
a control circuit coupled to the DAC circuit, the control circuit to clock gate provision of the first clock signal to the digital portion in absence of a conversion trigger or a refresh trigger; and
a comparator coupled to the DAC circuit, the comparator to receive a first analog voltage from a source circuit and a reference voltage from the DAC circuit, and compare the first analog voltage to the reference voltage, wherein in response to the refresh trigger, the control circuit is to enable the first clock signal to be provided to the digital portion to cause the DAC circuit to output the reference voltage to the comparator to refresh a storage element.

16. The integrated circuit of claim 15, wherein the control circuit comprises a first timer, and in response to expiration of the first timer, the control circuit is enable the first clock signal to be provided to the digital portion to cause the DAC circuit to output the reference voltage to the comparator to refresh the storage element, the expiration of the first timer comprising the refresh trigger.

17. The integrated circuit of claim 16, wherein the first timer is clocked with a second clock signal, the second clock signal having a substantially lower frequency than the first clock signal.

18. The integrated circuit of claim 15, wherein the control circuit is to prioritize the conversion trigger over the refresh trigger.

* * * * *